United States Patent
Pascucci (12)

(10) Patent No.: US 6,212,128 B1
(45) Date of Patent: Apr. 3, 2001

(54) ADDRESS TRANSITION DETECTOR IN SEMICONDUCTOR MEMORIES

(75) Inventor: Luigi Pascucci, Sesto S. Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/413,382

(22) Filed: Oct. 6, 1999

(30) Foreign Application Priority Data

Oct. 6, 1998 (IT) ............................................. TO98A0840

(51) Int. Cl.[7] ...................................................... G11C 8/00
(52) U.S. Cl. ......................................... 365/233.5; 365/233
(58) Field of Search ................................... 365/233, 233.5

(56) References Cited

U.S. PATENT DOCUMENTS

| | | | |
|---|---|---|---|
| 5,265,064 | * 11/1993 | Davies et al. | ........................ 365/233.5 |
| 5,729,492 | * 3/1998 | Campardo | .......................... 365/233.5 |
| 5,815,464 | * 9/1998 | Golla et al. | ........................ 365/233.5 |
| 5,886,949 | * 3/1999 | Villa et al. | ......................... 365/233.5 |

* cited by examiner

*Primary Examiner*—Trong Phan
(74) *Attorney, Agent, or Firm*—Theodore E. Galanthay; Stephen C. Bongini; Fleit, Kain, Gibbons, Gutman & Bongini P.L.

(57) ABSTRACT

An address transition detector in a semiconductor memories, which provides means for obtaining two complementary address transition signals from an address signal and send them to a monostable circuit apt to emit output pulse signals on an output node as a function of logical status changements of said address signal, said monostable circuit comprising bistable memory circuits for storing the values of the address transition signals at each logical status changement of the adddress signal through a feedback path, said values of the address transition signals being apt to control selection means of the complementary address transition signals. According to the present invention, said monostable circuit (123; 223; 303; 403) has breaking means (140; 240; 340; 440) of the feedback path (FB) in response to an enable signal (AE).

13 Claims, 4 Drawing Sheets

ADDRESS TRANSITION DETECTOR IN SEMICONDUCTOR MEMORIES

SPECIFICATION

1. Field of the Invention

The present invention relates to an address transition detector in semiconductor memories, which provides means for obtaining two complementary address transition signals from an address signal and send them to a monostable circuit apt to give out output pulse signals on an output node as a function of logical status changements of said address signal, said monostable circuit including bistable memory circuits for storing the values of the address transition signals at each logical status changement of the address signal through a feedback path, said values of the address transition signals being apt to control selection means of the complementary address transition signals.

2. Background of the Invention

Address transition detectors known as ATD (Address Transition Detection) are used in semiconductor memories for providing the initial pulse for those memories, which even if not driven by an external clock signal, i.e. asynchronous, can operate as if they were driven through an internal clock signal, i.e. as if they were synchronous.

ATD circuits generate a single pulse when one or more of their inputs—which may be represented by address signals or any selection signals—change their logic status. A pulse acts like an original clock signal for subsequent clock signals controlling timings of various internal operations. Said internal operations, mostly related to read cycles, include for instance bitlines precharge and equalization operations, as well as automatic switch-off functions of the memory circuit.

Since an ATD circuit driving a read cycle is a circuit sensing any transition occurring within the addressing lines, it follows that an ATD circuit should have high transition sensitiveness, a fast response to transitions, capture capability for any kind of transition related to the addressing lines.

ATD circuits, due to their nature of original clock signals, start read cycles and operate resetting of read cycles, which were possibly previously started by the ATD circuits themselves.

This means that a new read cycle cannot be started if a previous read cycle has not been finished; in fact, each read cycle is suddenly interrupted if any kind of transition has occurred for any reason on the address lines and a pulse is generated as a result by the ATD circuit Therefore, any interference of the address lines, such as a transition of output buffers, or disturbances due to capacitive couplings between lines, may either interrupt or start read cycles. Additionally, said disturbances may also tale an oscillatory nature.

As a result of said peculiar operation of ATD circuits, each read request should be regarded as a sum of serial events, which starting from the stimulus of an address lines transition will produce an entire read cycle.

For this reason, early ATD circuits used to include a monostable circuit, obtained through a flip-flop. The monostable circuit just simply sensed each transition at its input, following to which a pulse was emitted. Thus, any interference could produce a pulse and a consequent wrong initialization or blocking of the read cycle.

FIG. 1 shows an address transition detector 1 according to the prior art. Here we have an address signal AD at the input of the address transition detector 1 in a stiffening circuit 2, where a stiffening circuit means a circuit apt to reduce sensitivity to weak pulses, wherefrom an address transition detector AX and its negate, i.e. a negated address transition detector AN are generated. A monostable circuit 3 is arranged downstream the stiffening circuit 2 for generating a pulse signal GL including a temporary memory circuit 4 for receiving the address transition detector AX. Therefore, the monostable circuit 3 comprises a depletion breaker transistor M1 on the path of the address transition detector AX and a breaker depletion transistor M2 on the path of the negated address transition detector AN. The monostable circuit 3 comprises an inverter 5 with an associated pull-up transistor M3 for recovering the fall due to the threshold of breaker transistors M1 and M2. Transistor input 5, which also forms the node whereon the pulse signal GL is taken, is connected to both the path related to the address transition signal AX and the path related to the negated address transition signal AN. A second inverter 6 is located downstream, whose output controls a switch transistor M4 separating the temporary memory circuit 4 from the input of the monostable circuit 3. The temporary memory circuit 4 consists substantially of a flip-flop obtained by placing an inverter 7 and an inverter 8 in series and taking the inverter output 8 back to the inverter input 7. Moreover, the inverter output 7 controls the breaker transistor M1, whereas the inverter output 8 controls the switch transistor M2. A breaker transistor M5 driven by the output of the inverter 5 is located between the output of the inverter 8 and the input of the inverter 7. In addition, the inverter 7 also has a pull-up transistor M6, similar to the inverter 5.

Therefore, when for instance the address transition signal AX goes from a low to a high logic level, the pulse signal GL will rise to high level; consequently, there will be a low logic level at the inverter output 5 and a high logic level at the inverter output 7, which puts the breaker transistor M5 in conduction. Thus, also at the input of the temporary memory circuit 4 a high logic level will inhibit the breaker transistor M1 and activate the breaker transistor M2, which returns the pulse signal GL to its low level. As a result, the length of the pulse signal GL will depend on the propagation speed of the signal in the monostable circuit 3. The temporary memory circuit 4 will retain information about the previous address internally.

The stiffening circuit 2 comprises an inverter 9 and an inverter 10, also configured as a flip-flop or latch, which have a breaker transistor M7 controlled by a noise signal N on their feedback path. When the signal N is at its high logic level, the feedback path is closed, the address transition signal AX similarly to the address signal AD returned to the input, so that a fake signal will find it more difficult to switch the input of the stiffening circuit i2.

However, the use of a stiffening circuit is not a very effective solution, since said circuit cannot be too stiff, i.e. to require an input signal too strong for transition detection, since there is the risk of missing detection of the real address transition. Moreover, since control of pulses duration is poor, some pulses may be "dirty", making it difficult for the subsequent circuits to sense them.

Finally, said circuit does not allow to adopt a 'full CMOS' architecture, so that its use in circuits operating at a low supply voltage, for instance 3.3 Volts, may be difficult. FIG. 2 shows an address transition detector 21 obtained under 'full CMOS' technology. Said address transition detector 21 consists of a transition signals generating circuit 22 and a monostable circuit 23, which comprises a temporary memory circuit 24. A driving circuit 29 is provided at the output of the monostable circuit 23.

The transition signals generating circuit 22 provides a NOR logic gate 30, whose inputs consist of the address signal AD and a chip enable signal CE. At the output of the logic gate 30 an inverter 28 originates the address transition signal AX and an inverter 31 in series with the inverter 28 generates the negated address transition signal AN.

Address transition signals AX and AN are sent at the input to respective passgate transistors PG1 and PG2, which form the monostable circuit input 23. The output of said passgate transistors PG1 and PG2 produces the pulse signal GL1', which is inverted by the driving circuit 29 and is exited as a pulse signal GL1.

Moreover, the signal is picked up at the input of the driving circuit 29 and forwarded in a feedback path to an inverter 25, whose output drives two relevant transistors M21 and M22 assembled in a 'totem-pole' configuration on their relevant transistors M23 and M24, which are driven by the address transition signal AX and negated address transition signal AN, respectively. Thus, transistors M21 and M22 have their drains connected to the nodes of the temporary memory circuit 24, which comprises an inverter 26 and an inverter 27, at whose inputs there is a previous address signal OAX and a previous negated address signal OAN. Moreover, memory circuit outputs 24 are used to drive passgate transistors PG1 and PG2.

Therefore, when the address signal AD is for instance at its high logic level, the same as it is for the chip enable signal CE, the address transition signal AX will be low and the inverter output 25 high, whereby transistors M21 and M22 go in conduction state. The address transition signal AX inhibits the transistor M23 simultaneously, while the transistor M24 is maintained conductive by the negated address transition signal AN. As a result, the previous address signal OAX is connected to ground and brought to its low logic level, thus inhibiting operation of the passgate transistor PG1, whereas the previous negated address signal OAN puts the passgate transistor PG2 in conduction state. The pulse signal GL1' goes back to its high logic level and the pulse signal GL goes to its low logic level.

Said circuit, even if obtained under 'full CMOS' technology using a symmetric monostable circuit with respect to transitions and containing, moreover, a memory circuit, is not completely free from the above drawbacks; for instance, it does not provide any control of pulses lenght and emission time. Moreover, it is not possible to force the emission of transition detection pulses in a synchronous way with evolutions of signals paced inside the memory, according for instance to the needs of read cycles in course.

SUMMARY OF THE INVENTION

It is the object of the present invention to solve the above drawbacks and provide an address transition detector in semiconductor memories, having a more efficient and improved performance.

Under this frame, it is the main object of the present invention to provide an address transition detector in semiconductor memories, which can be obtained under 'full CMOS' technology and is suitable to operate with low voltages.

A further object of the present invention is to provide an address transition detector in semiconductor memories, which has adequate capacity of capturing the real transitions of the address lines.

A further object of the present invention is to provide an address transition detector in semiconductor memories, which is capable of filtering any disturbances in a temporal region around the transition of the address lines.

A further object of the present invention is to provide an address transition detector in semiconductor memories, which is capable of delaying the emission of the transition detection pulse according to requirements.

A further object of the present invention is to provide an address transition detector in semiconductor memories, which allows to extend time lenght of the transition detection pulse. A further object of the present invention is to provide an address transition detector in semiconductor memories, which allows to force the emission of transition detection pulses in a in a synchronous way with evolutions of signals paced inside the memory. In order to achieve such aims, it is the object of the present invention to provide an address transition detector in semiconductor memories, incorporating the features of the annexed claims, which form an integral part of the description herein.

BRIEF DESCRIPTION OF THE DRAWINGS

Further objects, features and advantages of the present invention will become apparent from the following detailed description and annexed drawings, which are supplied by way of non limiting example, wherein.

DETAILED DESCRIPTION OF THE PREFERRED EMBODIMENT

Figure 3:
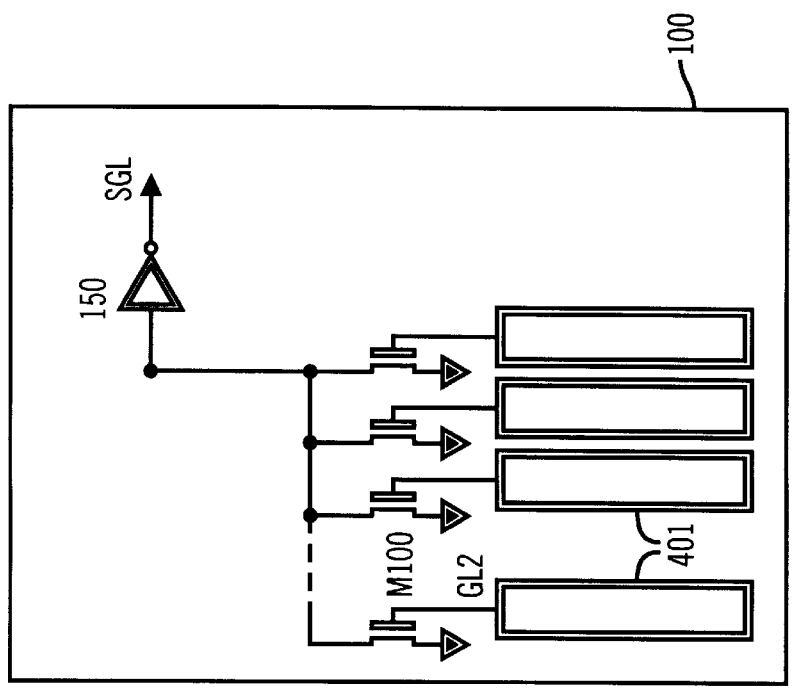
FIG. 3 shows a circuit diagram of an address transition detector architecture in semiconductor memories including an address transition detector in semiconductor memories, according to the present invention.

FIG. 3 shows an address transition detection architecture in semiconductor memories 100 according to the present invention. Said address transition detection architecture 100 provides a plurality of address transition detectors 401, each one receiving a different address signal AD at its input and generating a pulse signal GL2 at its output. Pulse signals GL2 control gate electrodes of transistors M100, which are connected between the ground and the input of a final drive circuit 150 supplying a final pulse signal SGL.

Said address transition detection architecture in semiconductor memories 100 produces a final pulse signal SGL at its output, substantially being originated from an OR logic operation among the various pulse signals GL2.

Figure 8:
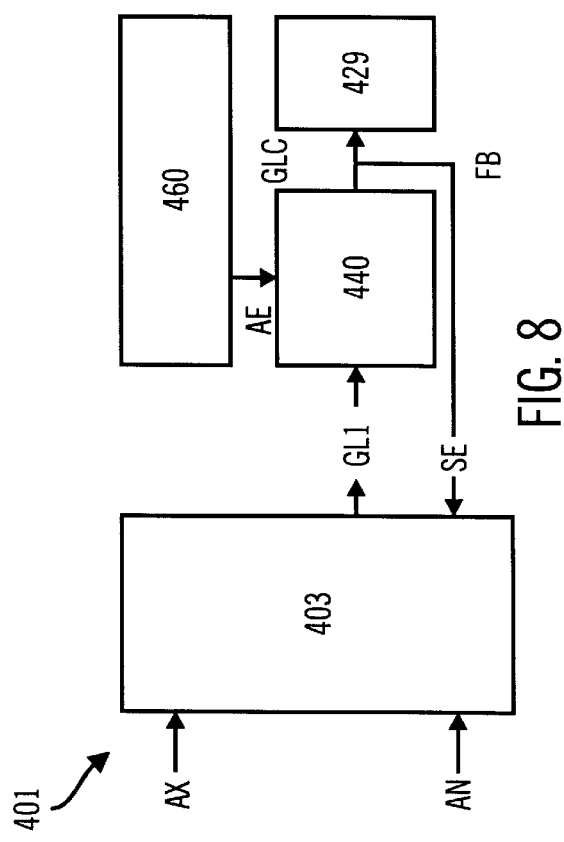
FIG. 8 shows a summarizing operation block diagram of a general address transition detector in semiconductor memories, according to the present invention.

FIG. 8 shows a summarizing operation block diagram of a general address transition detector 401, according to the present invention. Said address transition 401 comprises a transition detection and storage block 403, which receives the address transition signals AX and AN at its input producing from these an intermediate pulse signal GL1 at its output, which goes to the input of a pulse enable and synchronization block 440 controlled by an enable signal AE. Said enable signal AE is shown as generated by a memory timings generating block 460, which sets the intervals during which the enable signal AE is at its logic status apt to activate the pulse enable and synchronization block 440. Therefore, the memory timings generating block 460 is a timing block generating the enable signal AE, which is based for instance on read cycle statistics.

It may be requested, for instance, to have the disable interval corresponding to a time interval wherein an address transition is expected.

Thus, a controlled pulse signal GLC is obtained at the output of pulse enable and synchronization block 440 and sent to a drive block 429, whose function is to drive with the necessary current required by the circuits downstream. Moreover, the controlled pulse signal GLC is sent 403 to the transition detector and storage block 403 on a feedback path FB, such a path starting from the output of the transition detection and storage block 403, as a switch and storage signal SE for said transition detector and storage block 403.

Substantially, the pulse enable and synchronization block 440 is apt to interrupt the feedback path FB when the enable signal AE takes its proper logic status, hindering a changed logic status of address transition signals AX and AN from being transmitted as a switch and storage signal SE to the transition detector and storage block 403, i.e. a logic status of the pulse signal GLI cannot be returned to its basic status, thus ending the pulse interval. This only occurs after switching the enable signal AE for activating the pulse enable and synchronization block to reestablish feedback path FB again.

Figure 4:
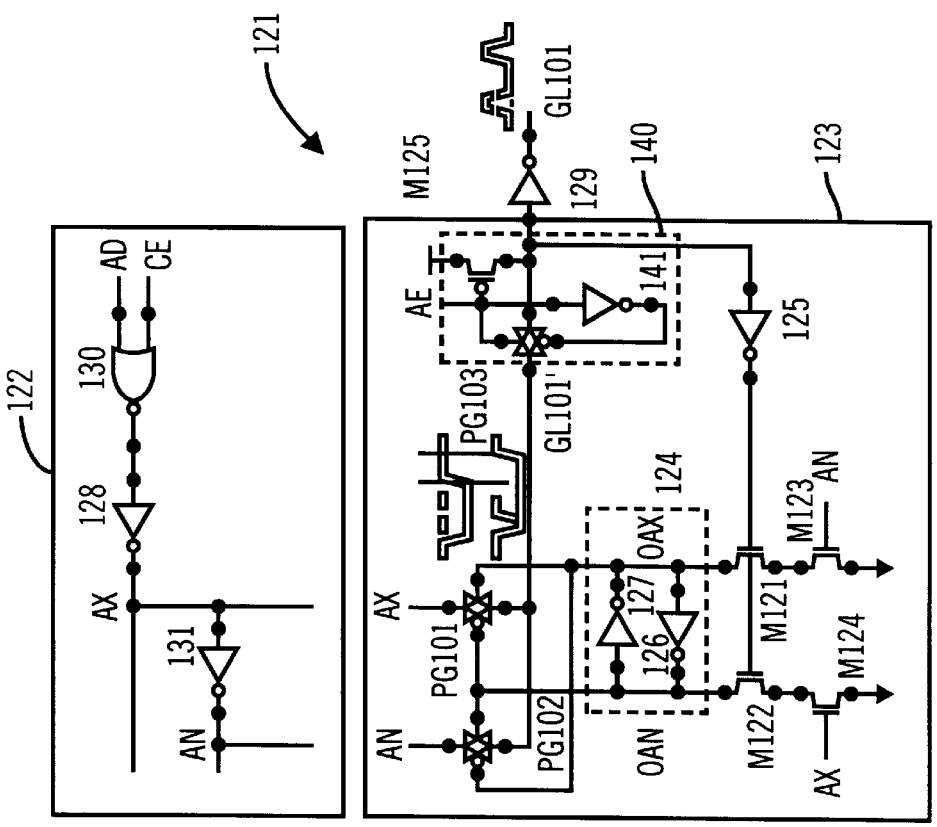
FIG. 4 shows a circuit diagram of an address transition detector in semiconductor memories, according to the present invention.
Figure 2:
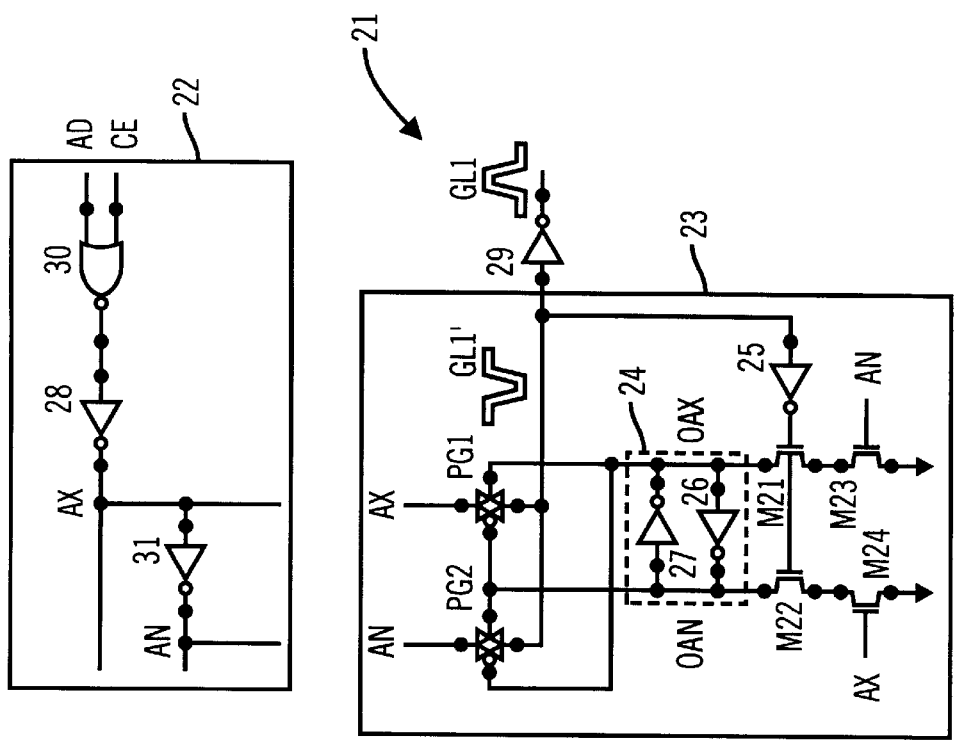
FIG. 2 shows a circuit diagram of a second address transition detector in semiconductor memories, according to the prior art.

FIG. 4 shows an address transition detector 121 according to a different embodiment of the present invention. Said address transition detector 121 is a circuit under 'fill CMOS' technology, i.e. substantially similar to the address transition detector 21 of FIG. 2. Therefore, common elements are indicated with the same numbers, adding number 100.

Said address transition detector 121 comprises a transition signal generating circuit 122, obtained through a NOR logic gate 130, an inverter 128 and an inverter 131. It also consists of a monostable circuit 123, comprising in its turn an intermediate memory circuit 124. The monostable circuit 123 comprises passgate transistors PG101 and PG102, an inverter 125, transistors M121, M122, M123 and M124. As already shown in FIG. 2, the intermediate memory circuit 124 comprises inverters 126 and 127. Always according to FIG. 2 a pulse signal GL101' is generated at the output of passgate transistors PG101 and PG102, whereas a drive circuit 129 is provided with a pulse signal GL101 generated at its output.

A decoupling circuit 140 controlled by an enable signal AE is provided between the output of passgate transistors PG101 and PG102 and the input of the drive circuit 129.

Said decoupling circuit 140 is substantially obtained through a passgate transistor PG103 located upstream the driving circuit input 122. Said passgate transistor PG103, is driven at the non-inverting input of the enable signal AE, whereas the inverting input is driven through the enable signal AE, which is inverted by a proper inverter 141. Moreover, a MOS p-type pull-up transistor M125 is also provided, driven by the enable signal AE and connected between the supply voltage and the driving circuit input 129.

Then, when the enable signal AE is at its low logic level, the decoupling circuit 129 will inhibit operation of the monostable circuit 123, which maintains its own status, in particular the previous address signals OAX and OAN independently from any evolutions of the address transition signals AX and AN. As a result pulse signals transitions GL101' and GL101 are delayed with respect to the transitions of address transition signals AX and AN and filtering of likely disturbances following in the interval while the enable signal AE remains at its low logic level will ensue, as better highlighted in FIG. 7.

Figure 5:
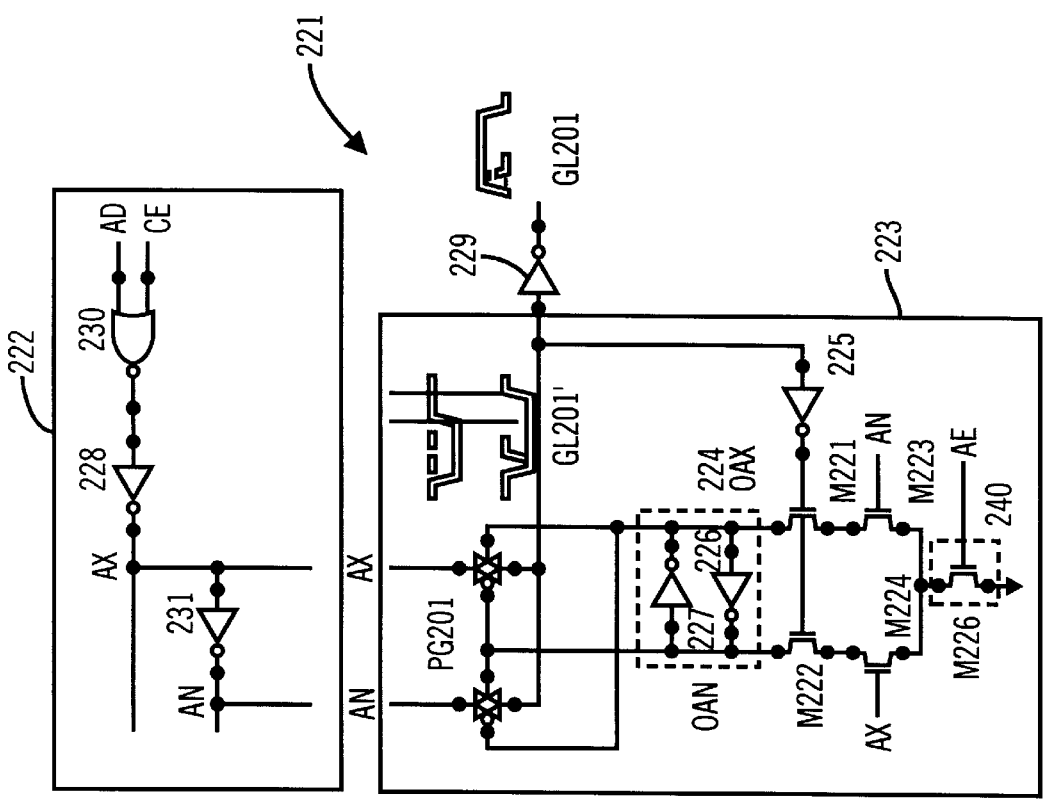
FIG. 5 shows a circuit diagram of a first embodiment of the address transition detector in semiconductor memories, according to FIG. 4.

FIG. 5 shows an address transition detector 221, which is another embodiment of the address transition detector 121 described with reference to FIG. 4. Common elements will be indicated with the same reference numbers, adding number 200.

Said address transition detector 221 has a decoupling circuit 240 obtained through a breaker transistor M226, which has its own gate electrode controlled by the enable signal AE and is connected between the ground and the drain of transistors M223 and M224. Therefore, when the enable signal AE is at its low logic level, the monostable circuit 223 remains in a memory status, i.e. passgate transistors PG201 and PG202 are controlled by the previous address signals OAX and OAN, allowing no changes of the address transition signals AX and AN to have access to the intermediate memory circuit 224. Therefore, pulse signals GL201' and GL201 will follow the trend of the address transition signals. When the enable signal AE is at its high logic level, the breaker transistor M226 becomes conductive and brings the drain of transistors M223 and M224 to ground; consequently the monostable circuit 223 is in the same operating condition as the monostable circuit 23 of FIG. 2.

The effect thus obtained is as follows:

during the time the enable signal AE is at its high logic status, operation of the monostable circuit 223 is inhibited, therefore the pulse signals GL201' and GL201 will maintain a stable value set by the address transition signals AX and AN.

When the enable signal AE is then brought to its low logic status, the monostable circuit 223 will resume operation and terminate the pulse of pulse signals GL201' and GL201.

From this results that the pulse length of pulse signals GL201' and GL201 can be controlled through the enable signal AE. This is particularly advantageous for the subsequent circuits that should be based on a correct recognition of said pulse for controlling clock signals.

Figure 1:
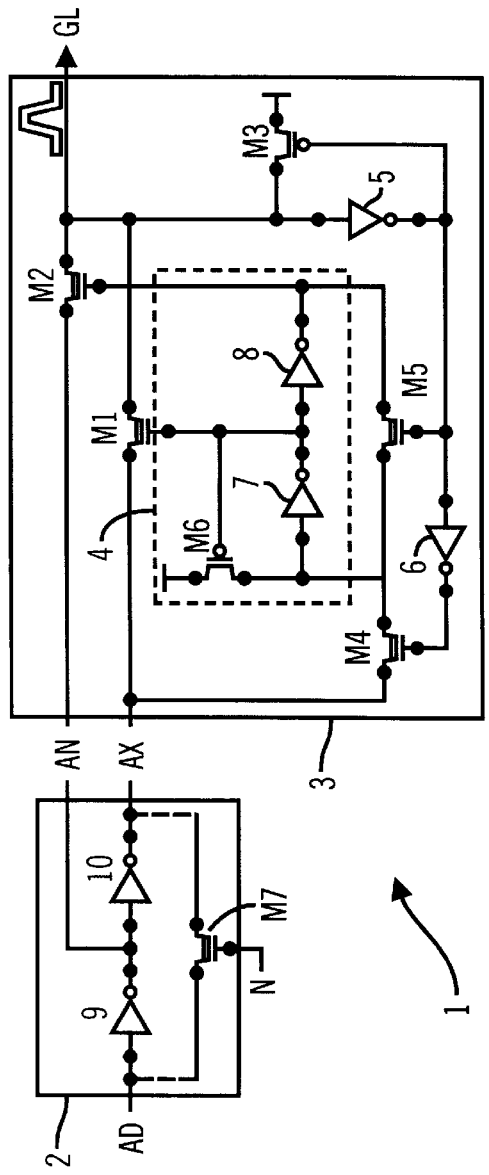
FIG. 1 shows a circuit diagram of a first address transition detector in semiconductor memories, according to the prior art.
Figure 6:
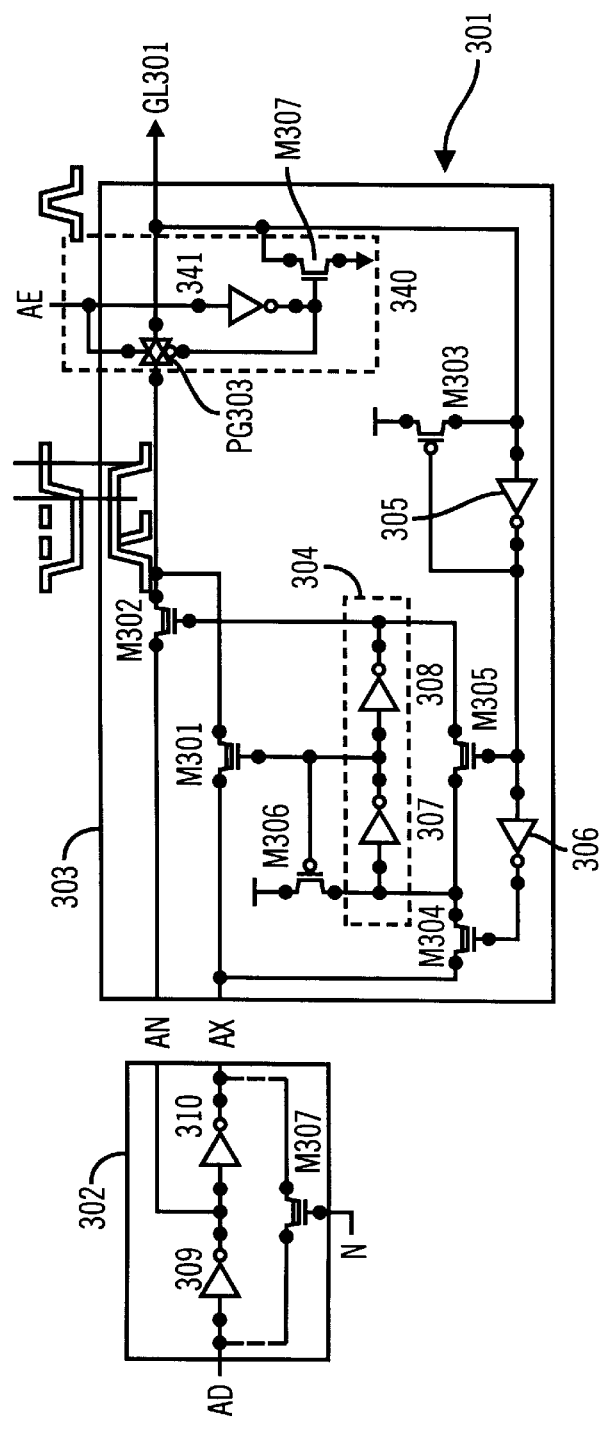
FIG. 6 shows a circuit diagram of a second embodiment of the address transition detector in semiconductor memories, according to FIG. 4.

FIG. 6 shows an address transition detector 301 having the same structure of the address transition detector 1 represented in FIG. 1. Common elements are indicated with the same numbers adding number 300.

The address transition detector 301 comprises a stiffening circuit 302 controlled by a noise signal N, followed by a monostable circuit 303. The monostable circuit 303 comprises a decoupling circuit 340 connected to the output node whereon the pulse signal GL301 is picked up; through a passgate transistor PG303 said circuit 340 is apt to hinder address transition signals AX and AN from extending towards the inverter 305. As for the decoupling circuit 140 of FIG. 4, an inverter 341 is provided to control the inverting input of the passgate transistor PG303, as well as a pull-up transistor M307 to bring back the inverter input 305 to its high logic status without any voltage losses due to the breaker transistors thresholds.

In this case, operation of the address transition detector 301 is similar to the address transition detector 121 as to the effect of the enable signal AE on the pulse signal GL 301, i.e. likely disturbances at the input will be filtered while the enable signal AE is low.

Thus, the solution according to the present invention can be applied to non "full CMOS" circuits.

Figure 7:
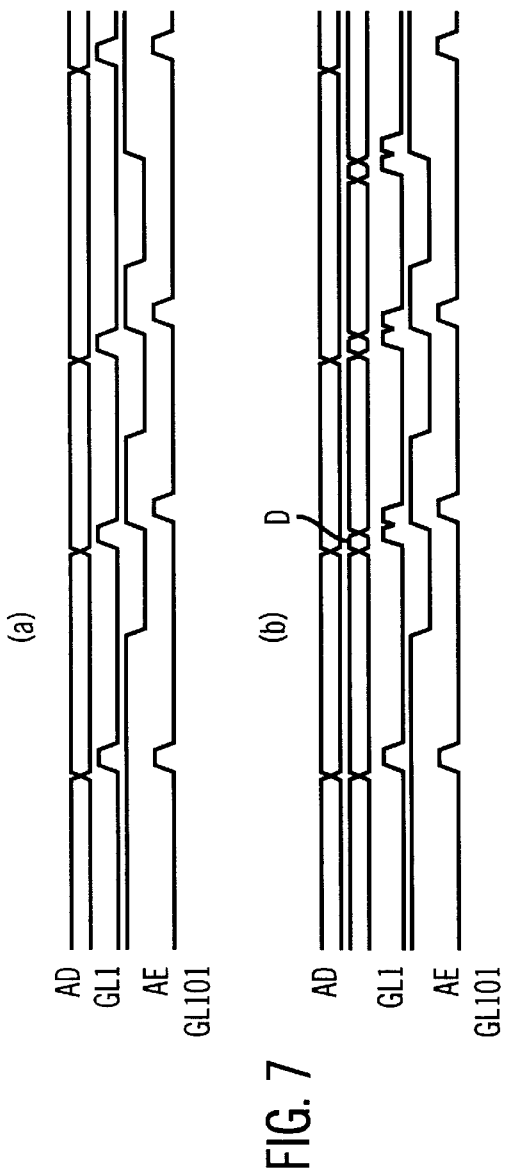
FIG. 7 shows a time diagram of the signals associated to the address transition detector in semiconductor memories, according to the present invention.

FIG. 7 shows a time diagram of the signals related to both the address transition detector 21 and address transition detector 121, with no noise.

Therefore the address signal AD is represented along with the pulse signal GL1, pulse signal GL101 and enable signal AE.

The pulse signal GL101 is similar to the pulse signal GL1, but time delayed by the enable signal AE.

FIG. 7b shows a time diagram of the signals related to both the address transition detector 21 and address transition detector 121 in the presence of disturbances D on the address signal AD.

As it can be noticed, the delay set by the enable signal AE allows a filtering of disturbances D, which are not present on the pulse signal GL101, whereas they cause double pulses on the pulse signal GL1.

From the above description the features of the present invention are clear and also its advantages will be clear.

Advantageously, the address transition detector in semiconductor memories according to the present invention can be achieved using "full CMOS" technology and be suitable for operation at low voltages. However, also non "full CMOS" embodiments are possible.

Through the adoption of the decoupling circuit 140, 240, 340 or 440 of the circuit output from the feedback ring of the monostable circuit, the address transition detector in semiconductor memories has the capacity of capturing real address lines transitions, excluding any disturbances.

In other words, it is possible to advantageously filter disturbances in a time interval around the address lines transition established by the timing of the enable signal. In particular, this occurs delaying the emission of the transition detection pulse according to the read cycle requirements in course, thus avoiding interruption of any read cycles.

Additionally, the address transition detector in semiconductor memories will advantageously allow extending time lenght of the transition detection pulse so as to avoid too short pulses that could be wrongly interpreted by the subsequent circuits.

Advantageously, the enable signal may be obtained from signals connected to the read cycles in course, such as automatic increments, so as to force the emission of transition detection pulses according to the evolutions of said signals.

Finally, the address transition detector in semiconductor memories produces a very low increment of circuit complexity with respect to known circuits.

It is obvious that many changes are possible for the man skilled in the art to the address transition detector in semiconductor memories described above by way of example, without departing from the novelty spirit of the innovative idea, and it is also clear that in practical actuation of the invention the components may often differ in form and size from the ones described and be replaced with technical equivalent elements.

What is claimed is:

1. An address transition detector in semiconductor memories, which provides means for obtaining two complementary address transition signals from an address signal and send them to a monostable circuit apt to emit output pulse signals on an output node as a function of logical status changements of said address signal, said monostable circuit including bistable memory circuits for storing the values of the address transition signals at each logical status changement of the address signal through a feedback path, said values of the address transition signals being apt to control selection means of the complementary address transition signals, characterized in that said monostable circuit (123; 223; 303; 403) has breaking means (140; 240; 340; 440) of the feedback path (FB) in response to an enable signal (AE).

2. An address transition detector in semiconductor memories according to claim 1, characterized in that said selection means of the complementary address transition signals comprise two controlled switches (PG101, PG102, PG201, PG202) for receiving relevant transition signals (AX; AN), whose output is connected to the feedback path (FB), said feedback path (FB) including additionally pull-down means (125, M121, M122, M123, 124, 225, M221, M222, M223, M224) driven by address transition signals (AX, AN) and apt to control the bistable memory circuit (124; 224), the output signals (OAX, OAN) of said bistable memory circuit (124; 224) driving controlled switches (PG101, PG102; PG201, PG202).

3. An address transition detector in semiconductor memories according to claim 2, characterized in that breaking means (140) of the feedback path (FB) are located upstream the output node of the pulse signal (GL101).

4. An address transition detector in semiconductor memories according to claim 3, characterized in that said breaking means (140) of the feedback path (PB) are connected to the output of said controlled switches (PG101, PG102).

5. An address transition detector in semiconductor memories according to claim 4, characterized in that said breaking means (140) are obtained through a controlled switch (PG103).

6. An address transition detector in semiconductor memories according to claim 2, characterized in that said breaking means (240) of the feedback path (FB) are located downstream the output node of the pulse signal (GL201).

7. An address transition detector in semiconductor memories according to claim 6, characterized in that said breaking means (240) are placed between the pull-down means (225, M221, M222, M223, M224) and the ground node.

8. An address transition detector in semiconductor memories according to claim 1 characterized in that the selection means of the complementary address transition signals comprise two depletion transistors (M301, M302).

9. An address transition detector in semiconductor memories according to claim 1 characterized in that said breaking means (140; 240; 340; 440) of the feedback path are placed downstream the depletion transistors (M301, M302).

10. A method for detecting address transitions in semiconductor memories, which provides the use of a monostable circuit producing an output pulse signal in response to address signal changements, said monostable circuit requiring to send a complementary pair of address signals to a transition detector and storage circuit, which obtains an intermediate pulse signal from said complementary pair of address signals, said intermediate pulse signal being used along a feeback path to reset a memory circuit comprised in the transition detector and storage circuit, characterized in that it provides an enable signal (AE), which is apt to interrupt the feedback path (FB) through a pulse enable and synchronization circuit (440) so as to hinder resetting of the memory circuit comprised in the transition detector and storage circuit (403).

11. A method for detecting address transitions in semiconductor memories according to claim 10, characterized in that the output pulse signal (GLC; GL101, GL201, GL301)

is hold to a constant voltage level when the feedback path (FB) is interrupted by the enable signal (AE).

12. A method for detecting address transitions in semiconductor memories according to claim 11, characterized in that the constant voltage level of said output pulse signal (GLC, GL101, GL201, GL301) corresponds to the low logic level.

13. A method for detecting address transitions in semiconductor memories according to claim 11, characterized in that the constant voltage level of the output pulse signal (GLC, GL101, GL201, GL301) corresponds to the high logic level.

* * * * *